United States Patent Office 3,520,683

Patented July 14, 1970

3,520,683

PHOTORESIST METHOD AND PRODUCTS PRODUCED THEREBY

Robert E. Kerwin, Westfield, N.J., assignor to Bell Telephone Laboratories, Incorporated, Murray Hill and Berkeley Heights, N.J., a corporation of New York No Drawing. Filed May 19, 1967, Ser. No. 639,601
Int. Cl. G03c 5/00
U.S. Cl. 96—35.1 11 Claims

ABSTRACT OF THE DISCLOSURE

A method of providing very adherent photoresist relief patterns has been developed which utilizes coupling agents of substituted silanes, at least one of whose substituents when hydrolyzed reacts with a substrate, and at least one of whose substituents is capable of bonding with a photoresist material.

This invention relates to an improved photoresist method for forming patterns on substrates and to the products produced thereby. More particularly, it relates to methods employing photoresists which contain coupling agents to promote their adhesion to substrates.

BACKGROUND OF THE INVENTION

In the manufacture of planar electronic devices, it is often necessary to process only a select portion of a substrate surface. One example is in the manufacture of printed circuits, where the material which forms the necessary circuit paths is placed in the appropriate pattern on the surface of a supporting body. Another example is found in the production of planar semiconducting devices where it is desired to etch the surface at only select areas. These procedures commonly utilize a photoresist method to provide the means for exposing only the selected surface areas to the particular process employed, e.g., electrodeposition, etching, etc. The process is made selective by providing the substrate surface with a protective material in the form of a desired pattern, so that the process will not be free to operate on the substrate surface everywhere. The protective material thus prevents electrodeposition, etching, etc., at those surface areas beneath the pattern.

Basically, certain photoresist materials upon exposure to light undergo chemical change of a nature such that they are rendered essentially insoluble in a particular solvent which is a good solvent for unexposed photoresist. By selectively exposing a photoresist-covered substrate to light through a light-mask, and by "developing" the resist with the appropriate solvent, only that portion of the resist which was exposed remains on the surface to protect it. The remaining pattern of photoresist is known as the "relief pattern." After further processing steps are completed, the relief pattern is removed as well.

In order for the relief pattern to be effective it must adhere strongly to the substrate during the resist development and electrodeposition or etch stages. Loosely adhering resists allow electrolytic or etchant solution to infiltrate intermediate the relief pattern and the substrate thereby causing irregularities which destroy the sharpness of the desired substrate pattern.

Requisite acuity is difficult to attend for dimensions on the order of $10^{-4}$ inches and less. At these dimensions, the infiltrative solution all but obliterates the pattern sought to be deposited or etched on the substrate. At greater dimensions, the problem still obtains although it is usually confined more to the edges of the pattern with increasing pattern size. In addition, when the substrate has been doped with diffused impurities, such as phosphorus or boron, the adherence of relief patterns is generally markedly poorer at all dimensions. It is essential that adherence on these substrates be improved because the necessary electronic properties that they exhibit.

One possible solution to the problem is the utilization of a bonding material to improve adhesion between the photoresist material and the substrate. However, the danger in using most bonding materials for this purpose is that the improved adherence may interfere with the development of the relief pattern when it is desired to remove that portion of the photoresist which was not exposed to the light.

SUMMARY OF INVENTION

In accordance with the present invention, an improved method of providing adherent relief patterns has been found by which excellent acuity may be attained generally, even at dimensions on the order of $10^{-5}$ inches and less. In addition to certain method steps hereinafter specified, the method involves the use of photoresist chemical systems which contain certain coupling agents. These agents are capable of coupling to the resist material when the latter is exposed to light. The bonding or coupling agents which have been found are capable, in the proper photoresist-substrate system, of selectively improved adhesion only where the photoresist is exposed to light, leaving unaffected the adherence of the unexposed portions of the photoresist which are to be removed in the development stage. Generally, the coupling agents of this invention are substituted silanes, at least one of the substituents being readily hydrolyzed to a hydroxy group which then reacts with the substrate, and at least one of the substituents being a functional group capable of bonding with the polymer resist material during cross-linking. Exemplary of the broad class of functional groups which can couple to the polymer resist are the vinyl silanes. The hydrolyzable group can be represented as $—Si(R)_3$. R can include among others, the halogens and oxyalkyl and acetoxy groups.

When the coupling agents of the invention are utilized, there is a substantial improvement in the acuity of the plated or etched lines as a result of the elimination of infiltrative solution intermediate the resist relief pattern and the substrate.

DETAILED DESCRIPTION OF INVENTION

As noted, one essential ingredient in all photoresists is the polymeric material whose solubility changes as a result of a light-activated cross-linking reaction. For this purpose, the polymeric cinnamic acid esters and polyisobutylene are excellent materials. A widely used cinnamic acid ester is polyvinyl cinnamate, since it is a good carrier for the light-sensitive activator and is itself a light-sensitive material. It is usually combined with a polynuclear quinone sensitizer, although other well-known sensitizers may also be used. Upon exposure to UV light, the light-sensitive polyvinyl cinnamate, for example, cross-links in a strong carbon-carbon bond to form a considerably toughened polymer material. In the cross-linked state, the polymer is no longer soluble in the solvent to be used in the selective photoresist development process.

In the case of other materials, such as polyisobutylene, for example, cross-linking is more difficult to accomplish and the presence of strong cross-linking initiators is necessary. Initiators typically found in such photoresist systems are aromatic azides which produce reactive bifunctional nitrene intermediates upon exposure to UV light. Since it is bifunctional, the initiator provides the necessary bridge to effect cross-linking of the photoresist polymer chains.

The cross-linking reactions provide the mechanism by which an appropriate coupling agent can selectively improve adhesion only where the resist is exposed to light.

At the same time, the coupling agent must be able to react with the substrate material to form the appropriate bond therewith. For the photoresist materials noted above, the organosilanes, gamma - methacryloxypropyltrimethoxysilane, vinyltrichlorosilane, methylvinyldichlorosilane and vinyltriacetoxysilane, among others, provide the proper functional organic groups which actively cross-link with the polymer material. This involvement in the polymer reaction is very effective and quite complete. The $Si(R)_3$ group of the silane is readily hydrolyzed to a polyfunctional silanol group that effectively bonds with the substrate. Exemplary substrates are $SiO_2$, $Al_2O_3$, and $Si_3N_4$, with or without dopants such as phosphorus and boron for example. The water necessary for hydrolysis may be that surface water present on the substrate surface under normal atmospheric conditions. This amount of water is quite small but it is sufficient because theoretically only a monolayer of the silanol at the surface is required. The reaction of the silanol group with the substrate requires some heat which is best provided in the course of a prebaking operation carried out before the applied resist is exposed to light.

The markedly improved adhesion which is characteristic of the invention is realized with as little as 5 weight percent of the organosilane based on the solids in the resist solution. Further improvement in adhesion is observed with increasing concentration of organosilane. While adhesion would be further improved with higher concentrations of the organosilane, 40 percent proves to be a fairly practical limit because the low molecular weight organosilane dilutes the polymer material and thus reduces the density and the solidarity of the cross-linked polymer that is formed on exposure.

Basically, the present invention contemplates selective improvement in the adherence of relief patterns and the substantial curtailment of infiltrative solution. However, because the problem of infiltrative solution is more serious in etching processes, where corrosive etchant is employed than it is in milder electroplating procedures, further reference to the invention will be in terms of etching processes. It is to be understood, however, that the invention is not limited to those cases where the processing step subsequent to the creation of the relief pattern is an etching process.

Moreover, the end use to which the fabricated substrate is put in no way limits the invention. Thus the substrates may be etched throughout or just to a partial depth; they may be doped with various impurities; and, once etched, they may be the ultimate product sought or simply an intermediate item of a larger process.

The organosilanes of this invention are compatible with, and operable in, polyvinylcinnamate and polyisobutylene resists among others, when used in accordance with the following method.

A clean substrate body such as $SiO_2$, $Si_3N_4$ or $Al_2O_3$, for example, is prepared. At least a sufficient amount of water should be present on the surface to promote hydrolysis of the silane to be added. The silane can be applied to the substrate surface either as a layer separate and distinct from the resist layer or together with the resist as a mixture. Whichever is the case, the materials are applied to the substrate as thin films. (Thin films may be formed by spinning, spraying, etc.)

Next, a prebaking operation is carried out to promote evaporation of the solvent which carried the resist, and to promote the hydrolysis and subsequent substrate reaction of the hydrolyzable group. This prebaking step is preferably conducted under a nonoxygen ambient, for example nitrogen, in order to avoid oxygen attack of the resist. A temperature range from about 60 to 90° C. provides acceptable rates of evaporation and reaction. Baking time varies from resist material to resist material, as well as being dependent upon the film thickness. Generally, prebaking requires from 5 to 20 minutes when conducted within the above temperature range, depending upon the rate of evaporation of the particular solvent from the particular resist system used.

After prebaking, the resist-covered substrate is exposed to UV light, typically in the 2500 to 550° A. range, through an appropriate light-mask. For this purpose, a high pressure mercury arc lamp proves to be excellent.

The exposed substrate is then developed in a developing bath of a solvent for the uncross-linked resist. Exemplary solvents are xylene, chlorinated hydrocarbon and Stoddard solvent. Development times are of the order of a few minutes. Development may be followed with a spray rinse of xylene, water or other suitable rinse liquid.

A post-baking step then follows to accelerate drying and hardening of the remaining cross-linked resist by removal of any remaining amounts of solvent. This procedure is not critical for successful operation of the invention, and accordingly, this temperature may be determined conveniently by those skilled in the art. After this step, the substrate with its selective resist pattern on the surface, is ready for eching. A common etchant is any of the buffered HF systems. During etching, the etchant attacks the substrate only where no resist remains to protect the surface.

Once etching is completed, the resist pattern is removed to yield a completed, etched product. Final resists removal may be carried out by any of several known techniques, such as by hot high pressure spray of carbon tetrachloride for a minute or so, or by boiling in hot concentrated sulphuric acid or by stripping with any commercial stripping agent. The resulting etched substrate is substantially free from any deterioration in the sharpness of the etched lines usually associated with infiltrative etchant. In accordance with the disclosed technique, etched patterns on the order of $10^{-5}$ inches have been made free from the problems associated with infiltrative etchant.

The following example describes the particulars of this method:

EXAMPLE

A slice of single crystal germanium substrate was provided with a coating of $SiO_2$ of 2000 A. thickness. An amount of water present on the oxide coating under normal conditions was maintained thereon. The photoresist composition contained 20 percent by weight (based on the polymer) of gamma-methacryloxypropyltrimethoxysilane additive within polyvinyl cinnamate resists. The photoresist composition, with the additive present therein, was filtered through a 1 micron filter directly onto the oxide-coated substrate surface followed by spinning at 15,000 r.p.m., which resulted in a uniform 2800 A. film. The resist-coated substrate was baked at 80° C. for 10 minutes under a reduced pressure of nitrogen to dry the film and to accelerate the hydrolysis reaction of the additive and the water-covered substrate.

The resist-coated sample was exposed to the ultraviolet light of a 200-watt high pressure mercury arc lamp for 2 minutes. Before reaching the sample the light passed through a collimating lens, neutral density filters, and a photographic negative of the image to be produced in the photo-resist. The silane additive took part in the chemical cross-linking that occurred in those areas exposed to the light.

The exposed sample was immersed in xylene at 23° C. for 5 minutes to develop the image, i.e., to dissolve away the unexposed regions of the resist layer. The sample was then rinsed in methyl alcohol and acetone to remove the xylene, followed by drying and hardening by a 30-minute bake at 150° C. in a nitrogen ambient.

Etching of the $SiO_2$ layer was by means of a buffered hydrofluoric acid etching solution, at a rate of approximately 500 A. per minute. The etching solution consisted of 113 g. $NH_4F$, 170 cc. $H_2O$, and 20 cc. of 48% HF.

After etching the photoresist was removed from the surface by spraying the surface with hot (80° C.) chloroform under 80 p.s.i. pressure.

The patterns etched consisted of contact test holes on the order of 0.00025 x 0.001 inch. The holes produced were cleanly etched and exhibited none of the irregularities associated with infiltrative etchant. A repeat experiment without the addition of the organosilane produced holes which were irregularly shaped.

Duplicate experiments with polyisobutylene resists yielded the same improved pattern with the addition of the organosilane.

The invention has been described with reference to particular embodiments and examples thereof, but it is intended that variations therefrom which basically rely on the teachings of the invention are to be considered as within the scope of the description and the appended claims.

What is claimed is:

1. A method of selectively treating a substrate comprising the steps of
  providing at least an amount of water sufficient to produce a monolayer at the surface of the substrate for hydrolysis, and
  applying to the substrate a photoresist material comprising
    a photoactive polymer component capable of being rendered less soluble by a light activated cross-linking reaction and
    a substituted silane having a least one substituent readily hydrolyzable to a hydroxy group and at least one ethylenically unsaturated substituent capable of bonding with the polymer as the latter undergoes a linking reaction upon activation by light.

2. A method of claim 1 including a prebaking step consisting of heating at a temperature of 60° C. to 90° C. for at least five minutes, selectively exposing the substrate to light,
  removing the unexposed portions of the photoresist material,
all of which results in a photoresist relief pattern on the substrate, then
  applying etching material to the substrate at the uncovered portions thereof,
  followed by removing the photoresist pattern from the substrate.

3. The substrate produced in accordance with the process of claim 2.

4. A method of claim 1 including a prebaking step consisting of heating at a temperature of 60° C. to 90° C. for at least five minutes, selectively exposing the substrate to light,
  removing the unexposed portions of the photoresist material,
all of which results in a photoresist relief pattern on the substrate, then
  plating material onto the substrate at the uncovered portion thereof,
  followed by removing the photoresist pattern from the substrate.

5. The substrate produced in accordance with the process of claim 4.

6. The process of claim 1 wherein the polymer component is selected from the group consisting of polyisobutylene and a cinnamic acid ester of polyvinyl alcohol and cellulose.

7. The process of claim 6 wherein the amount of the silane is 5 to 40 weight percent based on the polymer component.

8. The process of claim 7 wherein the silane is gamma-methacryloxypropyltrimethoxysilane.

9. The process of claim 8 wherein the silane is vinyltrichlorosilane.

10. The process of claim 9 wherein the silane is methylvinyldichlorosilane.

11. The process of claim 10 wherein the silane is vinyltriacetoxysilane.

References Cited

UNITED STATES PATENTS

| | | | |
|---|---|---|---|
| 3,398,210 | 8/1968 | Plueddemann et al. | 260—827 |
| 3,405,017 | 10/1968 | Gee | 96—36.2 |

FOREIGN PATENTS

| | | |
|---|---|---|
| 894,186 | 4/1962 | Great Britain. |

GEORGE F. LESMES, Primary Examiner

J. R. MILLER, Assistant Examiner

U.S. Cl. X.R.

96—36, 36.2; 117—34; 156—13